United States Patent [19]

Moyal

[11] Patent Number: 5,047,664
[45] Date of Patent: Sep. 10, 1991

[54] TRIMMING CIRCUIT

[75] Inventor: Miki Moyal, Austin, Tex.

[73] Assignee: Advanced Micro Devices, Inc., Sunnyvale, Calif.

[21] Appl. No.: 383,918

[22] Filed: Jul. 21, 1989

[51] Int. Cl.$^5$ .................. H03K 3/26; H03K 3/335
[52] U.S. Cl. .................. 307/303; 307/296.1; 357/51
[58] Field of Search .................. 307/296.1, 202.1, 303; 357/51

[56] References Cited

U.S. PATENT DOCUMENTS

| | | | |
|---|---|---|---|
| 4,104,546 | 8/1978 | Seiler | 307/202.1 |
| 4,532,607 | 7/1985 | Uchida | 307/202.1 |
| 4,593,203 | 6/1986 | Iwahashi et al. | 307/202.1 |
| 4,797,578 | 1/1989 | Eriksson | 307/303 |

Primary Examiner—Stanley D. Miller
Assistant Examiner—Richard Roseen
Attorney, Agent, or Firm—Foley & Lardner

[57] ABSTRACT

There is disclosed a trimming circuit for use in integrated circuits for adjusting a circuit parameter to a desired level. The trimming circuit includes an input terminal and a fuse coupled between the input terminal and a supply voltage. The fuse is convertible from a low resistance condition to an open circuit condition in response to a first voltage potential applied to the input. The trimming circuit also includes circuit means coupled to the input for causing the circuit parameter to be permanently adjusted in response to the fuse being converted to the open circuit condition and is also responsive to a second voltage potential applied to the input for causing the circuit parameter to be temporarily adjusted without the fuse being converted to the open circuit condition. With the application of the second voltage potential, the appropriateness of the circuit parameter adjustment may be determined before the fuse is converted to the open circuit condition and hence, before the circuit parameter is permanently adjusted.

16 Claims, 1 Drawing Sheet

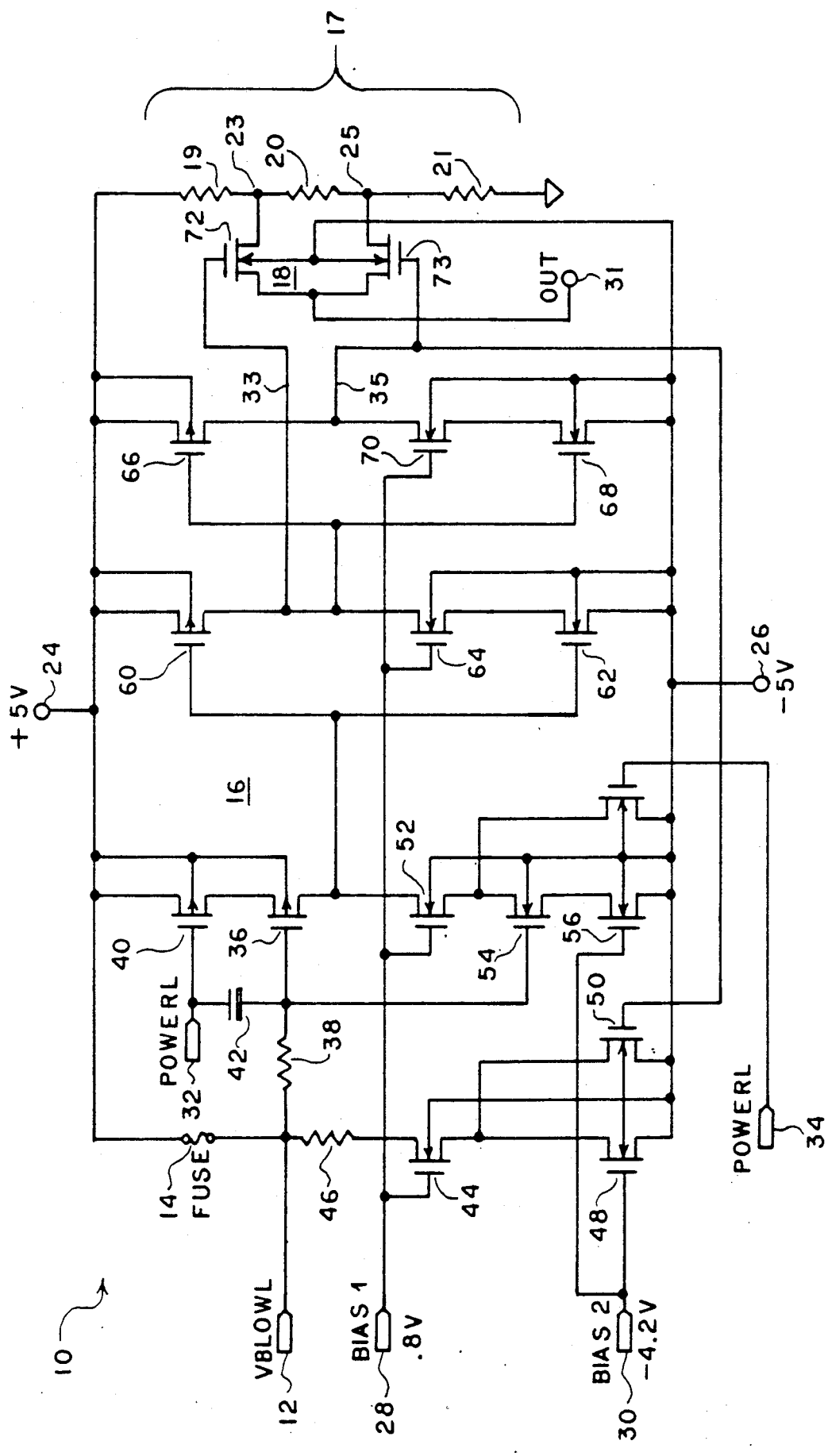

TRIMMING CIRCUIT

BACKGROUND OF THE INVENTION

The present invention is generally directed to a trimming circuit for permanently setting a circuit parameter, such as a voltage, to a desired level. The present invention is more particularly directed to such a circuit wherein the circuit parameter may be temporarily set to an adjusted level to enable the determination as to whether the adjusted level is the desired level before the circuit parameter is permanently set.

There are many applications where it is necessary to externally adjust a circuit parameter of a circuit in order to provide a desired circuit parameter value. One such application is in the field of integrated circuits wherein it is necessary to externally adjust a particular parameter value, such as a voltage level, to derive bias or reference voltages of particular levels. In such applications, the integrated circuit generally includes a voltage divider including a plurality of serially coupled resistors with voltage taps between the resistors and a trimming circuit associated with at least some of the taps. The trimming circuits are responsive to externally applied voltages for selecting one of the taps to provide a voltage from the voltage divider of a desired level. The externally applied voltages are used to open circuit a fuse within each trimming circuit and, once a fuse is open circuited, the trimming circuit causes the resistor divider tap associated with that fuse to be permanently selected. Through this process, the voltage can be adjusted to a particular value.

While such arrangements for trimming voltage levels has been generally successful, there has been a continual problem in that it has not been known what effect the tap selection would have on the overall circuit until after the particular tap has been selected. This has been caused by the resistance values of the voltage dividers not being exactly the values anticipated and the adjustment process not being irreversible. Once a fuse has been converted from a low resistance condition to an open circuit, high resistance, condition, it cannot thereafter be re-converted to a low resistance condition. As a result, the trimming of such circuit parameters has been a "blind" operation with the potential for a resulting voltage level not being at the desired required level. This can cause an integrated circuit to operate out of certain required specifications resulting in the reject of the integrated circuit with no avenue for correcting the problem.

It is therefore a general object of the present invention to provide a new and improved trimming circuit for adjusting the value of a circuit parameter.

It is a more particular object of the present invention to provide such a trimming circuit wherein a voltage level may be temporarily set to enable the determination of the appropriateness of permanently and irreversibly setting the voltage level.

It is a still further object of the present invention to provide such a trimming circuit which may be implemented in an integrated circuit.

SUMMARY OF THE INVENTION

The invention therefore provides a trimming circuit for adjusting a circuit parameter to a desired level. The trimming circuit includes an input and a fuse element coupled to the input. The fuse element is convertible from a first state to a second state by the application at the input of a first input condition. The trimming circuit further includes circuit means for adjusting said circuit parameter from a first level to a second level in response to the fuse element being converted from the first state to the second state and is also responsive to the application at the input of a second input condition for temporarily adjusting the circuit parameter to the second level without the fuse being converted from the first state to the second state. As a result, the appropriateness of the circuit parameter being at said second level may be determined before the fuse element is converted from the first state to the second state.

The invention further provides a trimming circuit for adjusting a circuit parameter to a desired level. The trimming circuit includes an input terminal and a fuse coupled between the input terminal and a supply voltage. The fuse is convertible from a low resistance condition to an open circuit condition by the application of a first voltage potential to the input terminal. The trimming circuit further includes circuit means for permanently adjusting the circuit parameter from a first level to a second level in response to the fuse being converted to the open circuit condition and is also responsive to the application of a second voltage potential to the input terminal for temporarily adjusting the circuit parameter to said second level without the fuse being converted to the open circuit condition. As a result, with the application of the second voltage potential, the appropriateness of the circuit parameter being at the second level may be determined before the second voltage potential is applied to the input terminal and the fuse is converted to the open circuit condition for permanently adjusting the circuit parameter to the second level.

The invention still further provides a trimming circuit for use in an integrated circuit including a voltage divider formed by a plurality of series coupled resistors having at least one tap between a pair of the resistors for selecting the at least one tap. The trimming circuit includes output means coupled to the at least one tap, an input terminal, and a fuse coupled between the input terminal and a supply voltage. The fuse is convertible from a low resistance condition to an open circuit condition in response to a first voltage potential applied to the input. The trimming circuit further includes circuit means coupled to the output means for causing the output means to permanently select the at least one tap in response to the fuse being converted to the open circuit condition and is also responsive to a second voltage potential applied to the input for causing the output means to temporarily select the at least one tap without the fuse being converted to the open circuit condition.

The present invention also provides a latch means for use in a trimming circuit which assures the permanent maintenance of the circuit parameter adjustment.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawing, in the sole figure of which identical reference characters indicate identical elements, and wherein the sole figure is a schematic circuit diagram of a trimming circuit embodying the present invention which may be implemented in an integrated circuit utilizing CMOS technology.

DESCRIPTION OF THE PREFERRED EMBODIMENT

Referring now to the sole figure, it illustrates a trimming circuit embodying the present invention. The trimming circuit 10 as illustrated is of a type which may be implemented in integrated circuit form utilizing CMOS technology and, as will be more fully described hereinafter, includes a plurality of CMOS field-effect transistors. The trimming circuit 10 is also particularly adapted for use in a subscriber line audio interface circuit but may also find application to advantage in many other types of integrated circuits as well.

The trimming circuit 10 generally includes an input terminal 12, a fuse 14, a circuit means 16, and an output means 18. The output means 18 is coupled to a voltage divider 17, including a plurality of resistors 19, 20 and 21 coupled in series relation and forming taps 23 and 25. The output means 18 includes an output terminal 31 which is coupled to the first tap 23 through an N-channel field-effect transistor 72 and the second tap 25 through another N-channel field-effect transistor 73. The voltage at terminal 31 is the voltage to be adjusted from a first level taken at tap 23 to a second level taken at tap 25.

Prior to the adjustment process, tap 23 is coupled to the output 31 to provide the first voltage level. As will be seen hereinafter, however, during the adjustment process, circuit means 16 causes the output means 18 to temporarily couple tap 25 to output 31 to enable the determination as to whether the second voltage level at output 31 is equal to a desired voltage. If the second voltage level at output 31 is found to be equal to the desired voltage, the fuse 14 is open-circuited and the circuit means 16 in response to the fuse 14 being open-circuited will cause the output means 18 to permanently select tap 25. In this manner, the voltage at terminal 31 is adjusted from the first voltage level at tap 23 to the second voltage level at tap 25 after it is determined that it is appropriate to do so.

The circuit means 16 includes a first power supply terminal 24 to which is applied a +5 volts, a second supply terminal 26 to which is applied a −5 volts, a first bias terminal 28 to which is applied a 0.8 volts, and a second bias terminal 30 to which is applied −4.2 volts. The trimming circuit further includes power-up terminals 32 and 34 to which a −5 volts is applied when the integrated circuit of which the trimming circuit 10 forms a part is to be activated. The power-up voltage remains at these two terminals throughout the active use of the integrated circuit incorporating the trimming circuit 10.

The fuse 14 is coupled between power supply terminal 24 and input terminal 12. The input terminal 12 is also coupled to the gate of a P-channel field-effect transistor 36 through a resistor 38. The source of transistor 36 is coupled to the drain of another P-channel transistor 40 which has its source connected also to power supply terminal 24. Coupled between the gates of transistors 36 and 40 is a capacitor 42. The common junction of capacitor 42 and the gate of transistor 40 is coupled to the power-up terminal 32. Input terminal 12 is also coupled to the drain of an N-channel field-effect transistor 44 through a resistor 46. The gate of transistor 44 is coupled to the first bias supply terminal 28 and the source of transistor 44 is coupled to the drain of another N-channel field-effect transistor 48. The source of transistor 48 is coupled to the power supply terminal 26 and its gate is coupled to the second bias supply terminal 30.

The source of transistor 44 is also coupled to the drain of another N-channel field-effect transistor 50. The source of transistor 50 is also coupled to the power supply terminal 26.

Coupled between the drain of transistor 36 and power supply terminal 26 are a plurality of series coupled N-channel field-effect transistors 52, 54, and 56. As can be noted in the figure, the gate of transistor 52 is coupled to the first bias supply terminal 28, the gate of transistor 54 is coupled to a common junction of the resistor 38 and the gate of transistor 36, and the gate of transistor 56 is coupled to the second bias supply terminal 30. The common junction of the source of transistor 52 and the drain of transistor 54 is coupled to the drain of another N-channel field-effect transistor 58. The source of transistor 58 is coupled to the power supply terminal 26.

The common junction of the drain of transistor 56 and the drain of transistor 52 is coupled to the gate of a P-channel field-effect transistor 60 and the gate of an N-channel field effect transistor 62. The source of transistor 60 is coupled to the power supply terminal 24 and the source of transistor 62 is coupled to the power supply terminal 26.

The drain of transistor 60 is coupled to the drain of an N-channel field-effect transistor 64 which has its gate coupled to the first bias supply terminal 28. The source of transistor 64 is coupled to the drain of transistor 62.

The common junction of the drain of transistor 60 and the drain of transistor 64 is coupled to the gate of a P-channel field-effect transistor 66 and the gate of an N-channel field-effect transistor 68. The source of transistor 66 is coupled to the power supply terminal 24 and the source of transistor 68 is coupled to the power supply terminal 26. The drain of transistor 66 is coupled to the drain of another N-channel field-effect transistor 70. The gate of transistor 70 is coupled to the first bias supply terminal 28 and the source of transistor 70 is coupled to the drain of transistor 68.

One output 33 of circuit means 16 is taken at the common junction of the drain of transistor 60 and the drain of transistor 64 which is coupled to the gate of the output means N-channel field-effect transistor 72. The transistor 72 is coupled between the output terminal 31 and the tap 23 of the voltage divider 17. The tap 23 forms the common junction of resistor 19 and resistor 20.

A complimentary output 35 of the circuit means 16 is taken at the common node of the drain of transistor 66 and the drain of transistor 70 which is coupled to the gate of transistor 50 and the gate of transistor 73. Transistor 73 is coupled between the output terminal 31 and the tap 25 of the voltage divider 17. The tap 25 forms the common junction of resistor 20 and resistor 21.

As will be seen hereinafter, when the output means 18 selects tap 25 to adjust the voltage output to the second level, the circuit means output 33 provides a low voltage at the gate of transistor 72 to turn off transistor 72, and the complimentary output 35 provides a high voltage to the gate of transistor 73 to turn transistor 73 on. This connects the output 31 to tap 25 and the second voltage level. The high voltage provided by the complimentary output 35 is also impressed upon the gate of transistor 50 which forms a portion of a latch means. This maintains the selection of tap 25 as a safety measure should the open-circuited fuse ever re-fuse together.

As is customary with CMOS field-effect transistor technology, the bodies of the P-channel field-effect transistors are coupled to the positive supply terminal and the bodies of the N-channel field-effect transistors are coupled to the negative supply terminals. To that end, the bodies of transistors 36, 40, 60, and 66 are coupled to the positive power supply terminal 24 and the bodies of transistors 44, 48, 50, 52, 54, 56, 58, 62, 64, 68, 70, 72 and 73 are coupled to the negative power supply terminal 26.

In terms of the basic operation of the trimming circuit 10, when a low enough voltage is impressed upon the gate of transistor 36 to cause it to conduct, a similar low voltage will result at the gate of output means transistor 72 to cause transistor 72 to turn off and a high voltage will result at the gate of transistor 73 to cause transistor 73 to turn on. This causes tap 25 to be selected. The applied input voltage to the gate of transistor 36 may be of two different levels. One such level is the test level referred to herein as a second voltage potential which causes transistor 36 to conduct but which is insufficient to cause the fuse 14 to be converted from a low resistance state or condition to an open-circuit state or condition. However, the second voltage potential is sufficient to cause tap 25 to be selected. In this way, it may be determined whether it is appropriate to select tap 25. The second voltage potential may be 1.5 volts below the positive power supply potential, and hence, in accordance with this embodiment, on the order of +3.5 volts.

If it is considered appropriate to permanently select tap 25, another voltage potential may be applied to the input of the circuit means 16 which is referred to herein as a first voltage potential. The first voltage potential may be on the order of −5 volts which is sufficient to cause enough current to flow through the fuse 14 to convert fuse 14 from a low resistance state or condition to an open circuit state or condition. The −5 volts applied to the circuit means input 12 also causes tap 25 to be selected. Because the fuse is now open-circuited, the input of circuit means 16 is no longer coupled to the +5 volts at power supply terminal 24. As a result, the voltage potential at the gate of transistor 36 will be continually sufficiently low to cause tap 25 to be selected.

Because fuses in integrated circuits may at times re-fuse after being open-circuited, the circuit means 16 includes a latch means for maintaining the selection of tap 25 by providing the input of the circuit means 16 with a continuously low voltage level. This is obtained by the complimentary output 35 being coupled to the gate of transistor 50. The high voltage at the gate of transistor 50 provided by the complimentary output 35 when tap 25 is selected will cause transistor 50 to conduct which places a low voltage at the source of transistor 44. This in turn causes a low voltage to appear at the input 12 of the circuit means 16 to maintain a low voltage at the gate of transistor 36 to maintain transistor 36 in the conducting. The end result is the maintenance of the selection of tap 25.

When transistor 36 conducts, which would be the case when either the first or second voltage potentials are applied to the input of circuit means 16, transistors 62 and 64 will be on, transistor 66 will be on, and transistors 60, 68, and 70 will be off. With transistor 60 off and transistors 64 and 62 on, a low voltage will be obtained at output 33 and thus at the gate of transistor 72 to cause transistor 72 to be off. With transistor 66 on and transistors 68 and 70 off, a high voltage will be obtained at the complimentary output 35 which is impressed upon the gate of transistor 73 to cause transistor 73 to be on. With transistor 72 off and transistor 73 on, tap 25 is selected by being coupled to output 31 through transistor 73. As previously explained, when the fuse 14 is open-circuited, the latch means causes a low voltage to appear at the input 12 of the circuit means 16 to maintain the selection of tap 25.

When the voltage potential at the input of the circuit means 16 is above 3.5 volts, which would be the case when it is not desired to select tap 25 either temporarily or permanently, transistor 60 will be on and transistors 62 and 64 will be off. This places a high voltage at the gate of transistor 72 causing it to be on. In addition, transistor 66 will be off and transistors 68 and 70 will be on to provide the complimentary output 35 with a low voltage to cause transistor 73 to be off and transistor 50 to be off. As a result, tap 23 is coupled to the output 31 through transistor 72 to provide the output 31 with the first voltage level. Because transistor 50 is off, the latch means will not provide a low voltage to the input 12 of the circuit means 16.

As can be seen from the foregoing, if it is desired to adjust the voltage at output 31 from the first voltage level to the second voltage level by selecting tap 25, the second voltage potential is first applied to the input terminal 12 which is sufficient to turn on transistor 36 but insufficient to convert the fuse 14 from its low resistance condition to an open circuit condition. However, because the second voltage potential is sufficient to turn on transistor 36, tap 25 will be selected temporarily until the second voltage potential is removed. If it is determined that tap 25 should be permanently selected, the first voltage potential of −5 volts is applied to the input terminal 12 which causes the fuse 14 to be converted from its low resistance condition to its open circuit or high resistance condition. The −5 volts at input terminal 12 also turns on transistor 36 causing tap 25 to be selected. Because fuse 14 is now open-circuited, the power supply voltage of +5 volts is removed from the input 12 to cause tap 25 to be permanently selected. The latch means through transistors 50 and 44 then provide a low voltage, approximately equal to the first voltage potential, at the input 12 of circuit means 16 to assure that in accordance with the present invention, a low voltage at that input even though the fuse 14 may refuse sometime in the future.

When the trimming circuit 10 is first powered up, a −5 volts is applied to the power-up terminals 32 and 34. The −5 volts at terminal 32 cause transistor 40 to continuously conduct and thereby be a source of current for transistor 36. Capacitor 42 permits the initial −5 volts to be applied to the gate of transistor 36 so that the output of the trimming circuit will be in a known state when the circuit is first powered-up. After the capacitor 42 charges, the −5 volts at terminal 32 will no longer be impressed upon the gate of transistor 36 and the circuit is ready for its normal operation as described above.

From the foregoing, it can be seen that the present invention provides a trimming circuit for adjusting a circuit parameter to a desired level, which enables the appropriateness of the adjustment to be determined before the circuit parameter is permanently selected. As a result, by virtue of the present invention, it is possible to determine the effect of such an adjustment before the adjustment is permanently made.

While a particular embodiment of the present invention has been shown and described, modifications may be made, and it is therefore intended in the appended claims to cover all such changes and modifications which fall within the true spirit and scope of the invention.

What is claimed is:

1. A trimming circuit for adjusting a value of a circuit parameter from a first level to a second level and deciding whether the second level should be permanent, said trimming circuit comprising:
   an input;
   output means for providing said circuit parameter value;
   a current switching means coupled to said input, said current switching means being convertible from a first state to a permanent second state by the application at said input of a first input condition; and
   circuit means coupled to said input, said current switching means, and to said output means, for causing said output means to adjust said circuit parameter from said first level permanently to said second level in response to said current switching means being converted from said first state to said permanent second state, said circuit means also being responsive to the application at said input of a second input condition for causing said output means to nonpermanently adjust said circuit parameter from said first level to said second level only while said second input condition is applied at said input.

2. A trimming circuit as defined in claim 1 wherein said current switching means first state is a low resistance state and wherein said current switching means second state is a high resistance state.

3. A trimming circuit as defined in claim 1 wherein said current switching means has a first terminal coupled to said input and a second terminal coupled to a supply voltage.

4. A trimming circuit as defined in claim 3 wherein said current switching means is arranged to couple said supply voltage when in said first state.

5. A trimming circuit as defined in claim 3 wherein said first input condition is a voltage and wherein the potential difference between said first input condition and said supply voltage is on the order of ten volts.

6. A trimming circuit as defined in claim 3 wherein said second input condition is a voltage and wherein the potential difference between said second input condition and said supply voltage is on the order of 1.5 volts.

7. A trimming circuit as defined in claim 1 further including latch means coupled between said output means and said input and responsive to said first input condition for maintaining said circuit parameter at said second level.

8. A trimming circuit as defined in claim 1 wherein said circuit parameter to be adjusted is a voltage.

9. A trimming circuit for adjusting the value of a circuit parameter from a first level to a second level and deciding whether the second level should be permanent, said trimming circuit comprising:
   an input terminal;
   a current switching means coupled between said input terminal and a supply voltage and being convertible from a low resistance condition to a permanent open circuit condition by the application of a first voltage potential to said input terminal;
   output means for producing said circuit parameter;
   circuit means coupled to said input terminal, said current switching means, and said output means for permanently causing said output means to adjust said circuit parameter from said first level to said second level in response to said current switching means being converted to said permanent open circuit condition, said circuit means also being responsive to the application of a second voltage potential to said input terminal for causing said output means to nonpermanently adjust said circuit parameter to said second level only while said second voltage potential is applied to said input terminal.

10. A trimming circuit as defined in claim 9 wherein the potential difference between said supply voltage and said first voltage potential is greater than the potential difference between said supply voltage and said second voltage potential.

11. A trimming circuit as defined in claim 10 wherein said supply voltage is about +5 volts, wherein said first voltage potential is about −5 volts, and wherein said second voltage potential is about +3.5 volts.

12. A trimming circuit as defined in claim 9 further including latch means coupled between said input terminal and said output means for maintaining said circuit parameter at said second level after said current switching means is converted to said permanent open circuit condition.

13. A trimming circuit as defined in claim 9 wherein said circuit parameter to be adjusted is a voltage.

14. In an integrated circuit including a voltage divider formed by a plurality of series coupled resistors and having a plurality of taps, a trimming circuit for selecting one of said taps of said voltage divider and deciding whether said tap selection should be permanent, said trimming circuit comprising:
   output means coupled to said voltage divider;
   an input terminal;
   a fuse coupled between said input terminal and a supply voltage and being convertible from a low resistance condition to a permanent open circuit condition in response to a first voltage potential applied to said input terminal; and
   circuit means coupled to said input terminal and coupled to said output means for causing said output means to permanently select one tap of said plurality of taps in response to said fuse being converted to said permanent open circuit condition, said circuit means also being responsive to a second voltage potential applied to said input terminal for causing said output means to nonpermanently select said one tap without said fuse being converted to said permanent open circuit condition only while said second voltage potential is applied to said input terminal.

15. A trimming circuit as defined in claim 14 further including latch means coupled between said output means and said input terminal for causing said output means to maintain the selection of said one tap in response to said fuse being converted to said permanent open circuit condition.

16. A trimming circuit as defined in claim 15 wherein said latch means is arranged to apply a voltage potential to said input substantially equal to said first voltage potential.

* * * * *